(12) United States Patent
Richter

(10) Patent No.: US 10,510,935 B2
(45) Date of Patent: Dec. 17, 2019

(54) OPTOELECTRONIC COMPONENT HAVING A LEAD FRAME WITH A STIFFENING STRUCTURE

(71) Applicant: OSRAM Opto Semiconductors GmbH, Regensburg (DE)

(72) Inventor: Daniel Richter, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/765,836

(22) PCT Filed: Oct. 5, 2016

(86) PCT No.: PCT/EP2016/073752
§ 371 (c)(1),
(2) Date: Apr. 4, 2018

(87) PCT Pub. No.: WO2017/060280
PCT Pub. Date: Apr. 13, 2017

(65) Prior Publication Data
US 2018/0287026 A1   Oct. 4, 2018

(30) Foreign Application Priority Data
Oct. 5, 2015   (DE) .................. 10 2015 116 855

(51) Int. Cl.
*H01L 33/62* (2010.01)
*H01L 33/48* (2010.01)
*G02B 6/42* (2006.01)

(52) U.S. Cl.
CPC .............. *H01L 33/62* (2013.01); *G02B 6/426* (2013.01); *G02B 6/4283* (2013.01); *H01L 33/486* (2013.01)

(58) Field of Classification Search
None
See application file for complete search history.

(56) References Cited

U.S. PATENT DOCUMENTS

| 8,487,418 B2 | 7/2013 | Egoshi et al. |
| 2012/0138967 A1 | 6/2012 | Shimizu et al. |
| 2013/0020590 A1* | 1/2013 | Lin .................. H01L 33/60 257/88 |

(Continued)

FOREIGN PATENT DOCUMENTS

| DE | 20 2011 000 722 U1 | 9/2011 |
| DE | 10 2010 039 382 A1 | 2/2012 |
| DE | 10 2011 056 700 A1 | 6/2013 |

(Continued)

OTHER PUBLICATIONS

Notice of Reasons for Rejection dated Apr. 2, 2019, of counterpart Japanese Application No. 2018-515277, along with an English translation.

*Primary Examiner* — Grant S Withers
(74) *Attorney, Agent, or Firm* — DLA Piper LLP

(57) ABSTRACT

An optoelectronic component includes at least one optoelectronic semiconductor chip, wherein the semiconductor chip is arranged on a leadframe section, the leadframe section includes a stiffening structure projecting away laterally from the leadframe section, and the leadframe section, the stiffening structure and the semiconductor chip are embedded in an electrically insulating housing.

21 Claims, 16 Drawing Sheets

(56) References Cited

U.S. PATENT DOCUMENTS

2013/0221509 A1   8/2013   Oda et al.

FOREIGN PATENT DOCUMENTS

| JP | S58-130375 A | 8/1983 |
| JP | 2011-176264 A | 9/2011 |
| JP | 2012-204392 A | 10/2012 |
| JP | 2013-232592 A | 11/2013 |
| JP | 2015-037101 A | 2/2015 |

* cited by examiner

OPTOELECTRONIC COMPONENT HAVING A LEAD FRAME WITH A STIFFENING STRUCTURE

TECHNICAL FIELD

This disclosure relates to an optoelectronic component comprising an optoelectronic semiconductor chip and a leadframe comprising a stiffening structure, and to a method of producing the optoelectronic component.

BACKGROUND

Optoelectronic components comprising a variety of housings are known. The housings are optimized for specific application purposes. Changed requirements generally necessitate a redevelopment of the housing of an optoelectronic component.

There is nonetheless a need to provide an improved optoelectronic component and an improved method of producing an optoelectronic component.

SUMMARY

I provide an optoelectronic component including at least one optoelectronic semiconductor chip, wherein the semiconductor chip is arranged on a leadframe section, the leadframe section includes a stiffening structure projecting away laterally from the leadframe section, and the leadframe section, the stiffening structure and the semiconductor chip are embedded in an electrically insulating housing.

I also provide a method of producing an optoelectronic component including at least one optoelectronic semiconductor chip including providing a leadframe including a plurality of leadframe sections connected to one another via stiffening structures, applying at least one semiconductor chip on a top side of a first leadframe section, embedding the leadframe with the semiconductor chip into an electrically insulating housing, and separating the first leadframe section with the semiconductor chip and at least one stiffening structure from the rest of the leadframe to thus obtain the component.

BRIEF DESCRIPTION OF THE DRAWINGS

FIG. 9 shows a perspective view of a further example of a leadframe, wherein further leadframe sections and conduction elements have been dispensed with.

LIST OF REFERENCE SIGNS

Figure 1:
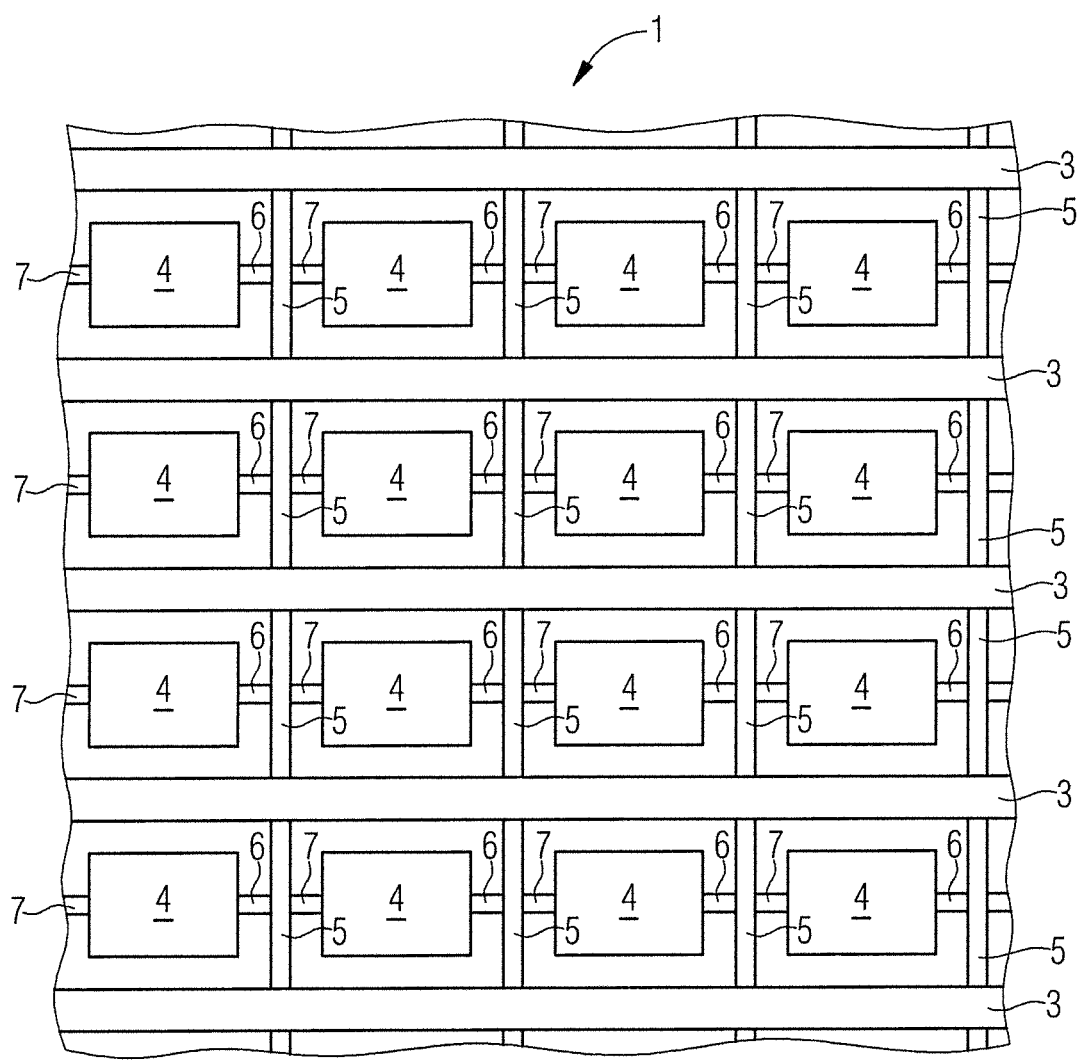
FIG. 1 shows a schematic partial segment from a leadframe comprising a plurality of leadframe sections and connection structures.

1 Leadframe
3 Strip
4 Contact pad
5 Connection web
6 First further connection web
7 Second further connection web
8 Segment
9 Leadframe section
10 First segment connection web
11 Second segment connection web
12 First segment further connection web
13 Second segment further connection web
14 First segment contact pad
15 Second segment contact pad
16 Third segment contact pad
17 Fourth segment contact pad
18 First semiconductor chip
19 Second semiconductor chip
20 Third semiconductor chip
21 Conduction element
22 First segment conduction element
23 Second segment conduction element
24 Third segment conduction element
25 Fourth segment conduction element
26 Housing material
27 Section
28 Housing
29 First line
30 Second line
31 Third line
32 First conduction element
33 Second conduction element
34 Third conduction element
35 Cut edge
36 Second housing 37 Conduction structure
38 Contact location
39 Second contact location
40 First further line
41 Second further line
42 Third further line
43 Fourth further line
44 Component
45 Second leadframe section
46 Third leadframe section
47 Fourth leadframe section
48 Fifth leadframe section
49 First electrical terminal
50 Second electrical terminal
51 Further connection web
52 First separating section
53 Second separating section

DETAILED DESCRIPTION

My optoelectronic component comprises a leadframe section on which an optoelectronic semiconductor chip is applied. The leadframe section comprises a stiffening structure. The leadframe section, the stiffening structure and the semiconductor chip are embedded in an electrically insulating housing. As a result of the stiffening structure being provided, a stable anchoring of the leadframe section in the housing is achieved.

The stiffening structure may connect to a further leadframe section. On the further leadframe section, a conduction element is preferably arranged on a top side of the further leadframe section. The further leadframe section and, depending on the structure chosen, the conduction element are likewise embedded in the housing. As a result of the further leadframe section being provided, a better mechanical fixing of the semiconductor chip in the housing is achieved. Moreover, there is an increased flexibility for an electrical contacting of the semiconductor chip via the further leadframe section.

To that end, an electrically conductive conduction element may be arranged on the further leadframe section. Depending on the structure chosen, the semiconductor chip borders right on the top side of the housing. Consequently, it is possible to achieve an electrical contacting of the semiconductor chip on the top side of the housing in a simple manner. Moreover, the conduction element likewise borders right on the top side of the housing. Consequently, the conduction element may also be electrically contacted via the top side of the housing in a simple manner.

The stiffening structure and/or the conduction element may be separated from the further leadframe section. An electrical insulation of the further leadframe section is achieved in this way. Moreover, in this way it is possible to use the further leadframe section and the conduction element of the further leadframe section for an electrical line independently of the electrical contacting of the leadframe section. An increased flexibility is achieved as a result. This is particularly advantageous in a plurality of leadframe sections in a housing and/or in a plurality of stiffening structures and further leadframe sections and/or in a plurality of optoelectronic components in a housing.

The leadframe section may comprise a second stiffening structure connected to at least one second further leadframe section. A second conduction element may be provided on the second further leadframe section, the second conduction element being arranged on a top side of the second leadframe section. The second stiffening structure is embedded together with the second further leadframe section and the second conduction element into the housing. An increased flexibility in the electrical contacting and in the electric current carrying in the housing is made possible in this way.

The second further leadframe section may be separated from the second stiffening structure. An electrical insulation of the second further leadframe section is provided in this way. Consequently, there is an increased flexibility in the use of the second further leadframe section for an electric current carrying.

The first and second stiffening structures and the first further and second further leadframe sections may be arranged on opposite sides of the leadframe section. In a further example, an electrical line is applied on a top side of the housing, wherein the electrical line is electrically contacted by a top side of the at least one semiconductor chip. A simple and reliable electrical contacting of a terminal of the semiconductor chip is achieved in this way.

The electrical line may be electrically contacted with at least a top side of a conduction element. In this way, it is possible to achieve a simple electrical contacting of a second terminal of the semiconductor chip via the conduction element and via the first and/or the second leadframe section.

A second semiconductor chip may be arranged on the leadframe section. The second semiconductor chip may be electrically conductively connected to an electrical line and/or to a conduction element in the same way as the first semiconductor chip. It is also possible for more than two semiconductor chips to be arranged on a leadframe section.

The geometry of the stiffening structure may be chosen to be smaller than the geometry of the leadframe section at least in one dimension. By way of example, the stiffening structure may comprise a smaller thickness and/or a smaller width than the leadframe section. The stiffening structure and the leadframe section may be configured in an integral fashion. In an analogous manner, the second stiffening structure may also comprise a smaller thickness and/or a smaller width than the leadframe section.

A second housing may be provided that comprises an electrical conduction structure. The second housing connects to the housing, wherein the conduction structure of the second housing electrically conductively connects to at least one semiconductor chip of the housing. The use of the second housing affords an increased flexibility in the configuration and the routing of the electrical lines to contact the component. The use of the second housing is advantageous particularly in a component comprising a plurality of conduction sections and/or comprising a plurality of semiconductor chips.

The component may comprise a semiconductor chip comprising two electrical terminals arranged on the underside of the semiconductor chip. The first electrical terminal is arranged on a first leadframe section and electrically conductively connects to the first leadframe section. The second electrical terminal is arranged on a further leadframe section of the component and electrically conductively connects to the further leadframe section. Consequently, it is possible to use semiconductor chips for the component that comprises the electrical terminals on opposite sides or on a common side.

At least one second semiconductor chip may be provided, wherein the second semiconductor chip comprises two electrical terminals on an underside. The first electrical terminal is arranged on the first leadframe section and electrically conductively connects to the first leadframe section. The second electrical terminal is arranged on a further leadframe section and electrically conductively connects to the further leadframe section.

A simple and cost-effective method of producing an optoelectronic component comprising at least one optoelectronic semiconductor chip is achieved by the fact that a leadframe comprising a plurality of leadframe sections connected to one another via connection structures is provided. At least one semiconductor chip is applied on at least one leadframe. Afterward, the leadframe with the semiconductor chip is embedded into an electrically insulating housing. Then, the leadframe section with the semiconductor chip and at least one stiffening structure is separated from the rest of the leadframe and the optoelectronic component is thus obtained.

An electrical connection between the leadframe section and a further leadframe section may be interrupted before or after the leadframe section is separated from the leadframe. An electrical insulation of the further leadframe section from the leadframe section is provided in this way. As a result, it is possible to use the further leadframe section independently of the first leadframe section for an electrical line routing.

The first leadframe section onto which the semiconductor chip is arranged may connect to a further leadframe section via a first stiffening structure. The further leadframe section increases the mechanical fixing of the semiconductor chip in the housing. Moreover, the further leadframe section may be used for an efficient electrical line routing. To that end, the further leadframe section may be provided with a conduction element which is led as far as a top side of the housing. Consequently, an electrical contacting of a rear side of the semiconductor chip may be achieved via the conduction element and the top side of the housing.

By way of example upon provision of a plurality of stiffening structures connected to the first leadframe section, the first leadframe section may be electrically isolated from at least one further leadframe section. The electrically conductive connection between the further leadframe section and the first leadframe section may be interrupted prior to the singulation of the component or after the singulation of the component.

The further leadframe section and the conduction element may be divided into at least two, in particular into four further leadframe sections and into four conduction elements during the process of separating the component. Production of a plurality of conduction elements and a plurality of further leadframe sections is simplified in this way.

The above-described properties, features and advantages and the way in which they are achieved will become clearer and more clearly understood in association with the following description of examples which are explained in greater detail in association with the drawings.

FIG. 1 shows, in a schematic illustration, a segment from a leadframe 1 comprising strips 3 arranged parallel, wherein a series of contact pads 4 is arranged between two strips 3 in each case. A connection web 5 is provided between two contact pads 4 in each case, the connection web connecting two adjacent strips 3 to one another. Each connection web 5 is additionally connected by two further connection webs 6, 7 to opposite contact pads 4 of a series.

The contact pads 4 are configured in a square fashion in the example illustrated. The contact pads 4 comprise a width approximately double the magnitude of that of the webs 3 in the example illustrated. The connection webs 5 comprise a smaller width and/or a smaller height than the strips 3 in the example illustrated. The contact pads 4 comprise a height identical to that of the strips 3 in the example illustrated. The height of the contact pads 4 may also deviate from the height of the strips 3. Moreover, the ratio of the geometries of the strips 3 and of the contact pads 4 may also be chosen differently. The leadframe 1 comprises an electrically conductive material, for example, copper or is formed from an electrically conductive material, for example, copper. Moreover, the arrangement of the contact pads, of the connection webs and of the further connection webs may also be arranged differently.

Figure 2:
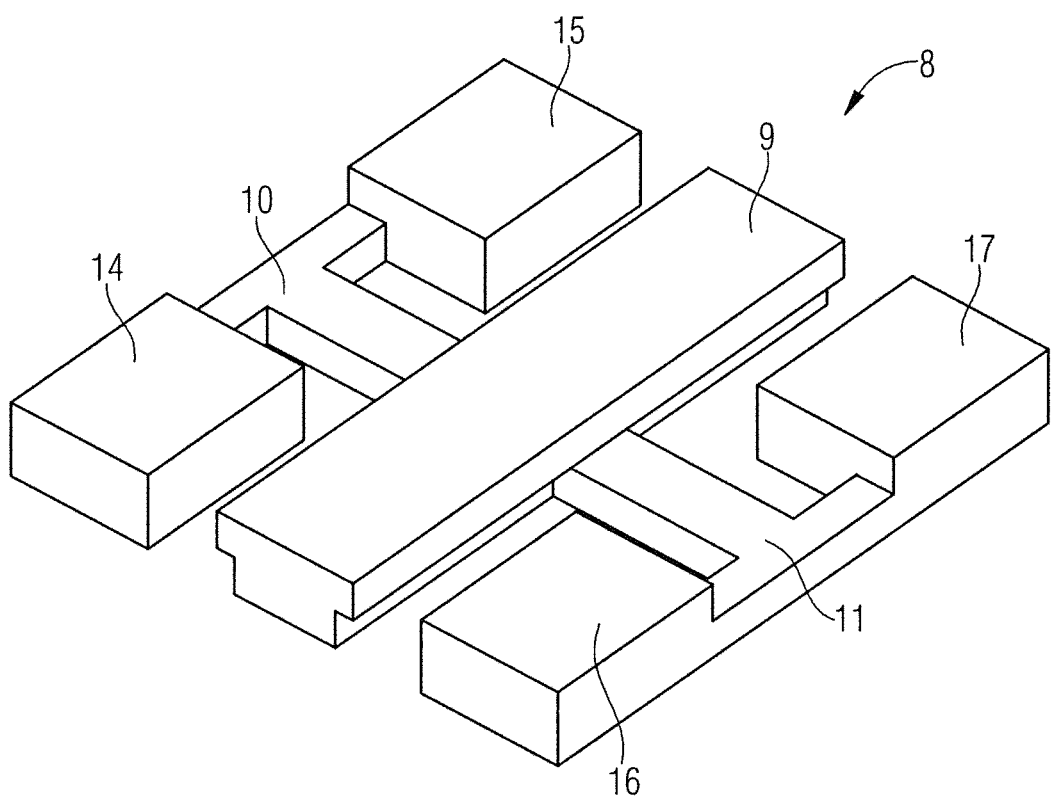
FIG. 2 shows a perspective illustration of a leadframe section comprising connection structures and further leadframe sections of a component.

FIG. 2 shows, in a schematic illustration, a segment 8 of the leadframe 1, which segment is used, for example, to form a component. The segment 8 comprises a first leadframe section 9 formed from a segment of a strip 3. Moreover, the segment 8 comprises in each case a first and a second segment 10, 11 that constitute part of two connection webs 5. Furthermore, the segment 8 comprises a first and a second segment 12, 13 of further connection webs 6, 7. Furthermore, the segment 8 comprises four segments 14 to 17 of four contact pads 4. In the illustrated example of the segment 8, each of the contact pads 4 is divided into four segments 14, 15, 16, 17 during the process of separating the leadframe 1. The segments 10, 11 of the connection webs and the segments 12, 13 of the further connection webs constitute a stiffening structure. The segments 14, 15, 16, 17 of the contact pads 4 constitute further leadframe sections that likewise constitute a stiffening structure.

Figure 3:
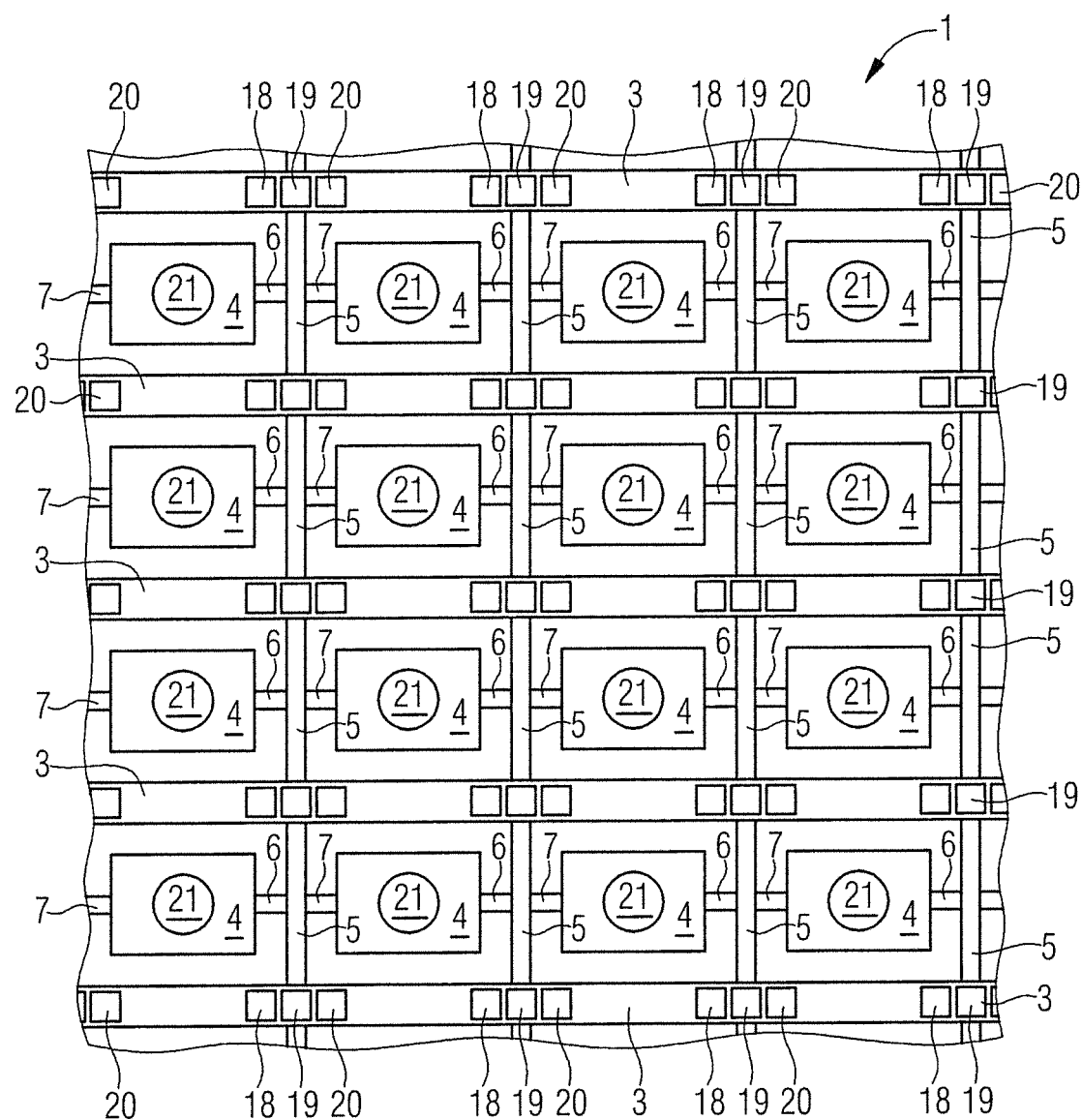
FIG. 3 shows a schematic illustration of the partial segment from the leadframe after the mounting of semiconductor chips on the leadframe sections and of conduction elements on the further leadframe sections.

FIG. 3 shows, in a schematic perspective illustration, a segment from the leadframe 1, wherein three semiconductor chips 18, 19, 20 are arranged onto the strips 3 between two contact pads 4. Moreover, a conduction element 21 is arranged centrally on each contact pad 4. The conduction element 21 comprises, for example, the same height as the semiconductor chips 18, 19, 20. It is also possible to arrange more or fewer semiconductor chips on the strip sections between two contact pads 4. Moreover, on a contact pad 4 it is also possible for a plurality of conduction elements 21 to be arranged, for example, in the four corner regions.

Figure 4:
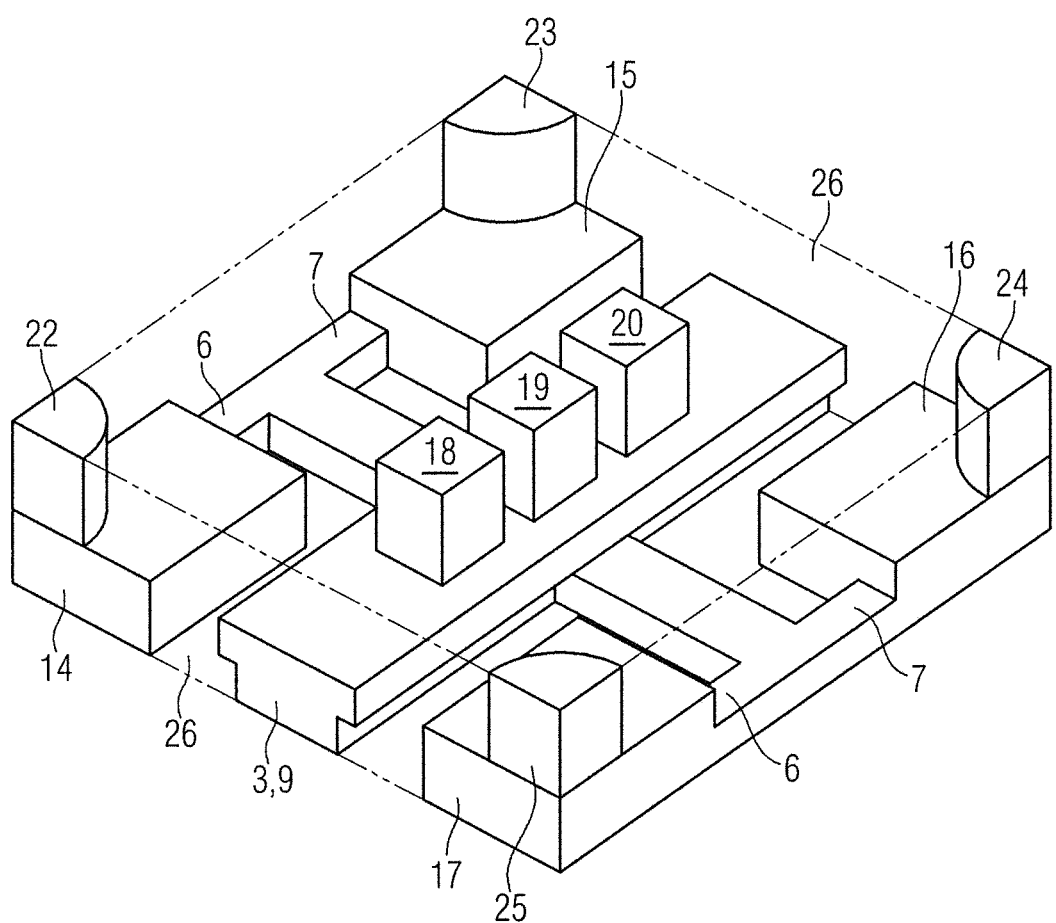
FIG. 4 shows a perspective illustration of the leadframe section, the connection structures, the further leadframe sections, the semiconductor chips and the conduction elements of a component after the embedding into the housing.

After mounting the semiconductor chips 18, 19, 20 and of the conduction elements 21 as illustrated in FIG. 3, the leadframe 1 is embedded into a housing material 26, as illustrated in a segment in FIG. 4.

FIG. 4 shows, in a perspective illustration, a segment 8 that has been cut out from the leadframe from FIG. 3, wherein the three semiconductor chips 18, 19, 20 and segments 22, 23, 24, 25 of the conduction elements 21 of four adjacent contact pads 4 are illustrated. Each of the segments 22, 23, 24, 25 of the conduction elements 21 constitutes a conduction element in each case by itself. The arrangement in FIG. 4 may be used to form a component.

The semiconductor chips 18, 19, 20 constitute optoelectronic semiconductor chips configured, for example, in the form of light emitting diode chips (LED chips) or in the form of light-absorbing semiconductor chips, for example, photodiode chips. The semiconductor chips 18, 19, 20 may be configured identically or differently. A light emitting diode chip and a photodiode chip may be arranged on a leadframe section 9. The light emitting diode chip may be configured to emit an electromagnetic radiation of arbitrary wavelength. Moreover, light emitting diode chips configured to emit electromagnetic radiation comprising different wavelengths may be arranged on a leadframe section 9. By way of example, a leadframe section 9 may comprise a light emitting diode chip comprising blue light, a light emitting diode chip comprising red light and a light emitting diode chip comprising green light.

The semiconductor chips 18, 19, 20 comprise a first electrical terminal, for example, on an underside connected to the leadframe section 9. Moreover, the semiconductor chips 18, 19, 20 comprise a second electrical terminal on a top side, arranged opposite relative to the underside. The conduction elements 21 are formed from an electrically conductive material or comprise an electrically conductive material.

The housing material 26 is formed from an electrically insulating material. The housing material may comprise or consist of one or more of the following materials, for example: silicone, epoxy, polyphthalamide, polycyclohexylene dimethylene terephthalate (PCT), plastics material, epoxy resin, adhesive or some other molding material (mold material). The housing material 26 may be applied on the leadframe 1, for example, by a molding method (mold method). In particular, compression molding or transfer molding, in particular film-assisted transfer molding, may be used. A leadframe 1 embedded into the housing material 26 is obtained in this case.

It is possible to prevent an electrically conductive connection between the leadframe section 9 and the conduction elements 22, 23, 24, 25. In this case, a partial section 27 of the segments 10, 11 of the connection webs may be removed from the rear side, for example.

Figure 5:
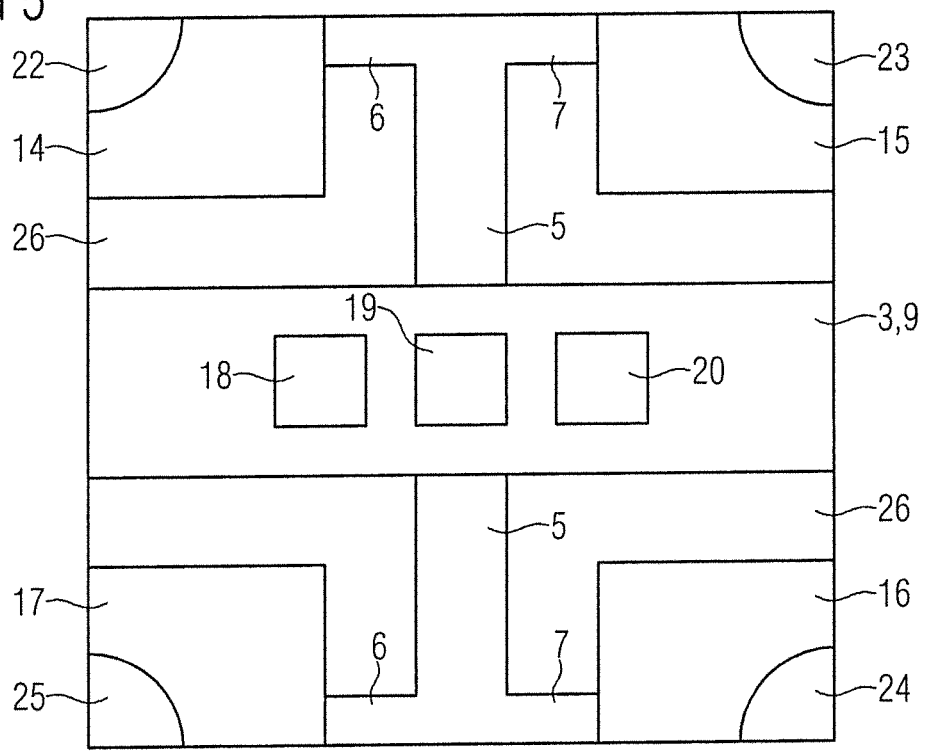
FIG. 5 shows a schematic view of FIG. 4 from above.
Figure 6:
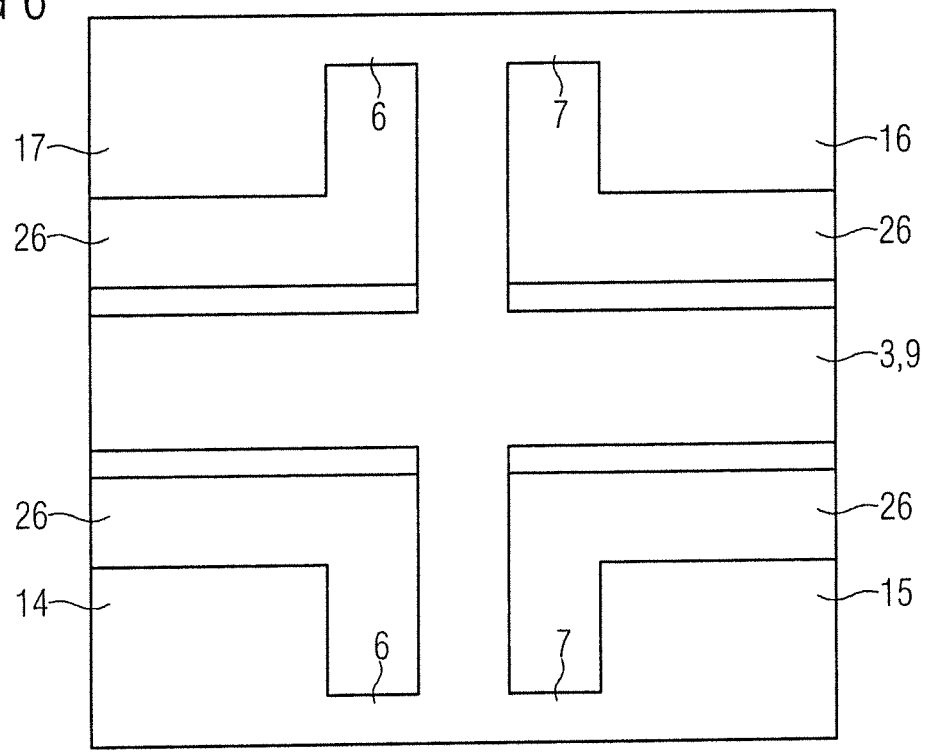
FIG. 6 shows a schematic view of FIG. 4 from below.

FIG. 5 shows a view of the partial segment from FIG. 4 from above. FIG. 6 shows a view of the arrangement from FIG. 4 from below. The leadframe sections may comprise more or fewer conduction elements and/or semiconductor chips.

Figure 7:
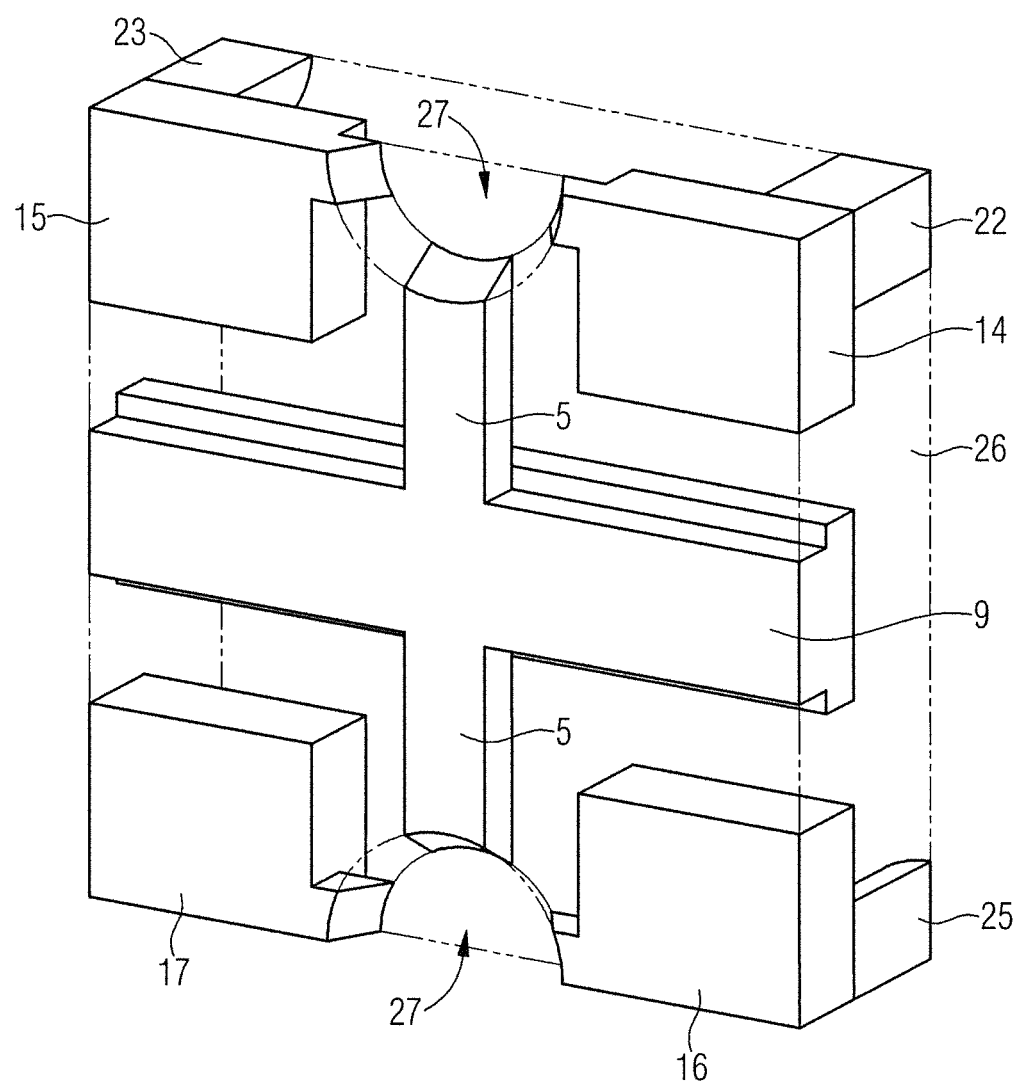
FIG. 7 shows a perspective view of a partial segment from the leadframe looking at the rear side, wherein the connection structure is separated from the further leadframe sections.

FIG. 7 shows a partial segment from a rear side of the leadframe 1 embedded into the housing material 26, wherein the electrically conductive connection between the segments 10, 11 of the connection webs and the segments 14, 15, 16, 17 of the contact pads is interrupted. Wet-chemical or dry-chemical etching methods may be used to remove the segments 27 from the segments 10, 11 of the connection webs. FIG. 7 shows a segment 8 of the leadframe, which segment is embedded into the housing material 26. Different segments of the contact pads may be electrically insulated from the leadframe section 9 by a section 27 of the connection web 5 being removed. As a result, the segments 14 to 17 of the contact pads 4 and the conduction elements 22, 23, 24, 25 connected thereto are separated from the leadframe 9. Individual segments 14, 15, 16, 17 of the contact pads 4 and the conduction elements 22, 23, 24, 25 thereof may also remain electrically connected to the leadframe 9. Particularly in a component comprising a plurality of segments 8, a wide variety of configurations of electrically conductively connected and electrically insulated segments of contact pads may be provided.

Figure 8:
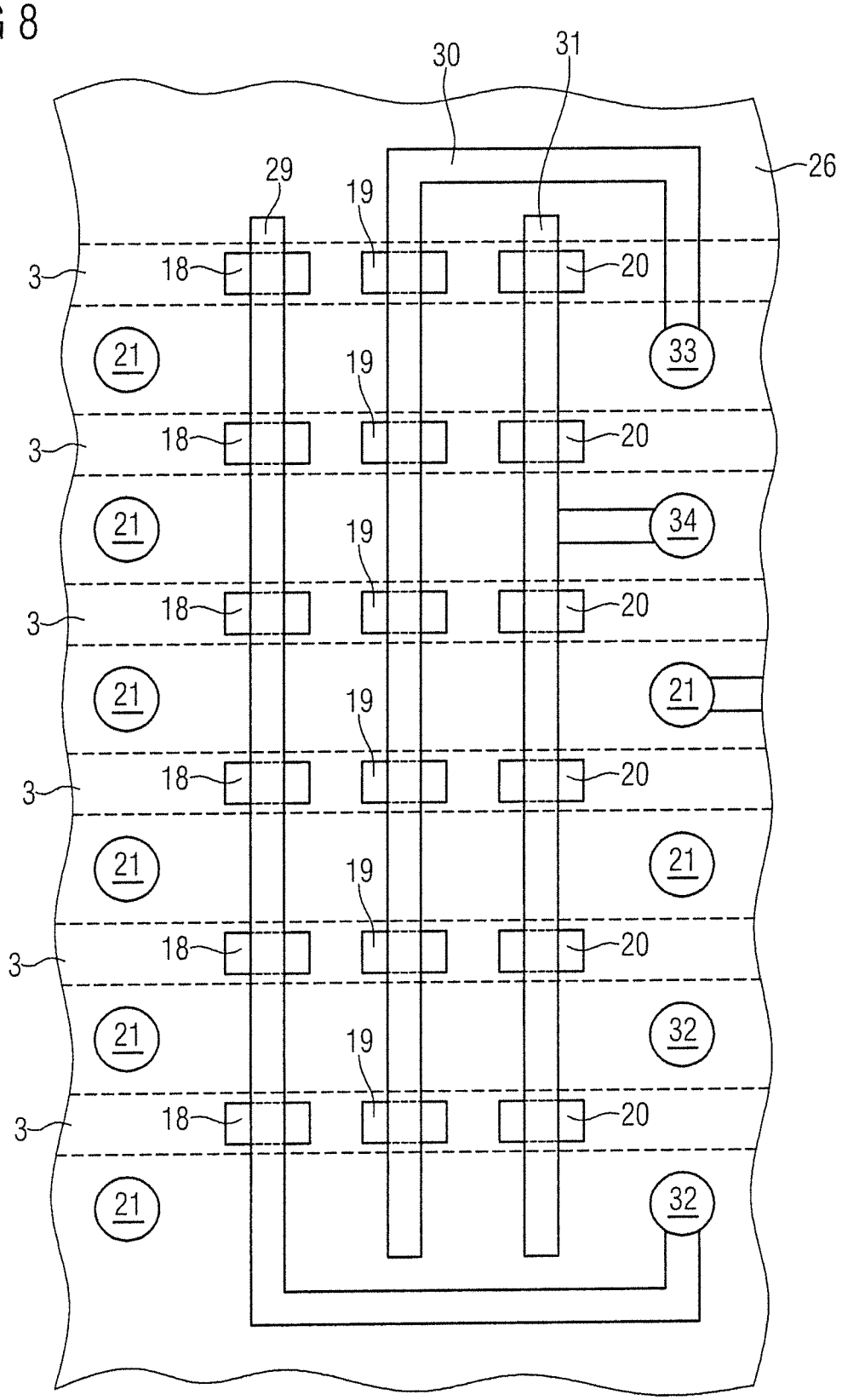
FIG. 8 shows a schematic illustration of the leadframe looking at a top side, wherein the semiconductor chips are contacted with the conduction elements via electrical lines.

FIG. 8 shows a view of a partial segment from a top side of the leadframe 1 embedded into the housing material 26 in accordance with FIG. 4. On the top side of the housing 28 formed by the cured housing material 26, electrical lines 29, 30, 31 are applied on the top side of the housing 28. In the example illustrated, the lines 29, 30, 31 are arranged perpendicularly to the strips 3, wherein the strips 3 are illustrated in a dashed manner. The semiconductor chips 18, 19, 20 and the conduction elements 21 are led as far as the top side of the housing material 26. Moreover, each of the lines 29, 30, 31 electrically conductively connects to a semiconductor chip of a strip 3. To that end, the lines 29, 30, 31 electrically connect to an electrical terminal of the top side of the semiconductor chips 18, 19, 20. Moreover, the three lines 29, 30, 31 electrically conductively connect to three different conduction elements. The first line 29 electrically conductively connects to a first conduction element 32. A second, middle electrical line 30 electrically conductively connects to a second conduction element 33. A third electrical line 31 electrically conductively connects to a third conduction element 34. With the aid of the electrical lines 29, 30, 31 the electrical terminal is led from the top side of the semiconductor chips 18, 19, 20 via the electrical lines 29, 30, 31 and the electrical conduction elements 32, 33, 34 onto the rear side of the housing 28 of the leadframe 1. The housing 28 comprises a multiplicity of these line arrangements comprising in each case three parallel lines 29, 30, 31 arranged alongside one another. The type of arrangement of the electrical lines 29, 30, 31 and the connection to the semiconductor chips 18, 19, 20 of the leadframe 1 may be chosen differently depending on the construction of the component.

Figure 9:
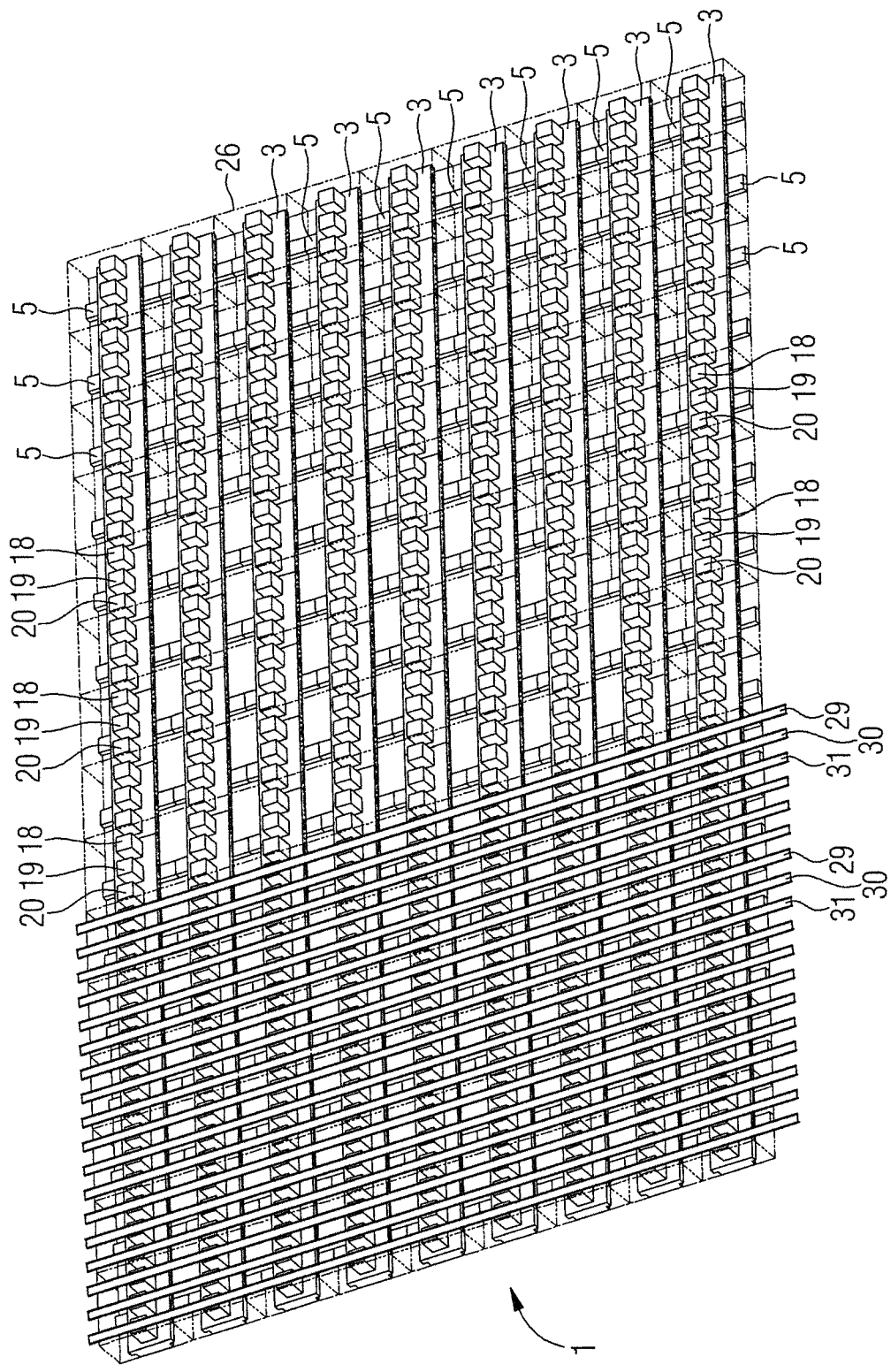

FIG. 9 shows, in a schematic illustration, a configuration of a leadframe 1 consisting of strips 3 arranged parallel to one another, wherein the strips 3 connect to one another via connection webs 5. In this example, no contact pads are arranged between the strips 3. Semiconductor chips 18, 19, 20 are arranged onto the strips 3. Electrical lines 29, 30, 31 are already illustrated on a left-hand side of FIG. 9. The electrical lines are arranged perpendicularly to the strips 3. Moreover, each electrical line 29, 30, 31 connects to a semiconductor chip of a strip 3. The leadframe 1 is also embedded into the housing material 26, which is illustrated in a transparent manner in the illustration in FIG. 9. Partial segments from the arrangement in FIG. 9 may be separated by a corresponding singulation step, wherein, in this example, an electrical contacting of the electrical lines 29, 30, 31 is carried out via further component parts (not illustrated).

Figure 10:
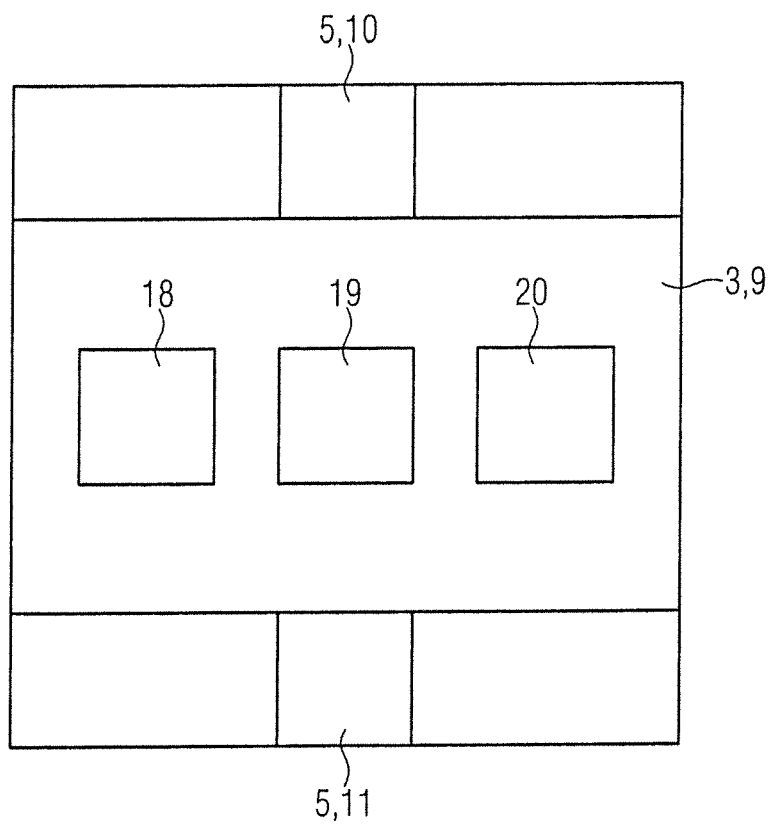
FIG. 10 shows, in a schematic illustration, a view of a partial segment from FIG. 9 without lines.

FIG. 10 shows a partial segment from the arrangement in FIG. 9 before the electrical lines are applied. The segment comprises a portion of a strip 3, three semiconductor chips 18, 19, 20 and segments 10, 11 of the connection webs.

Figure 11:
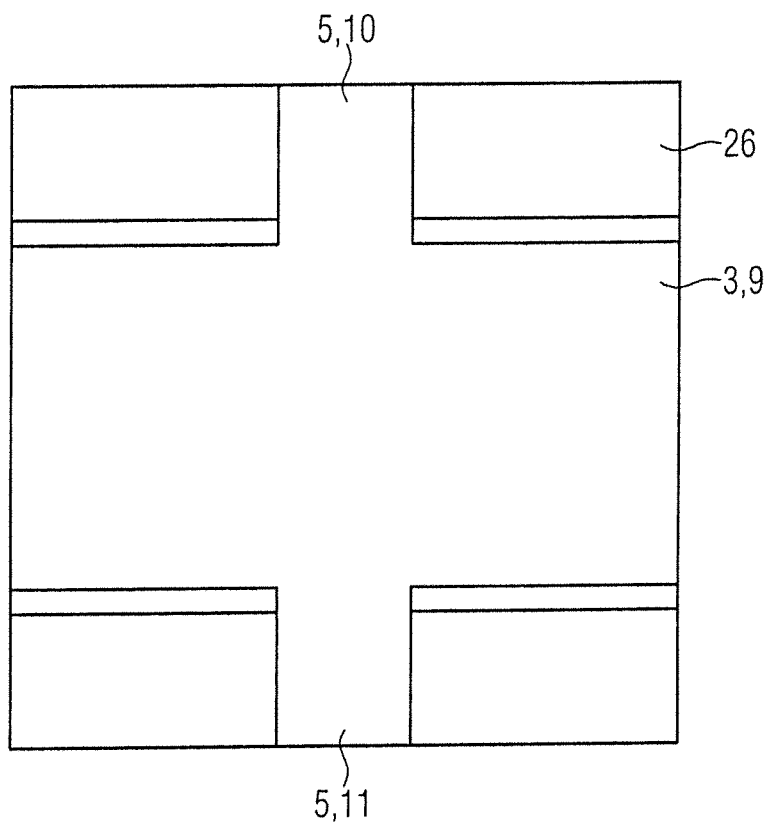
FIG. 11 shows the underside of the arrangement from FIG. 10.
Figure 12:
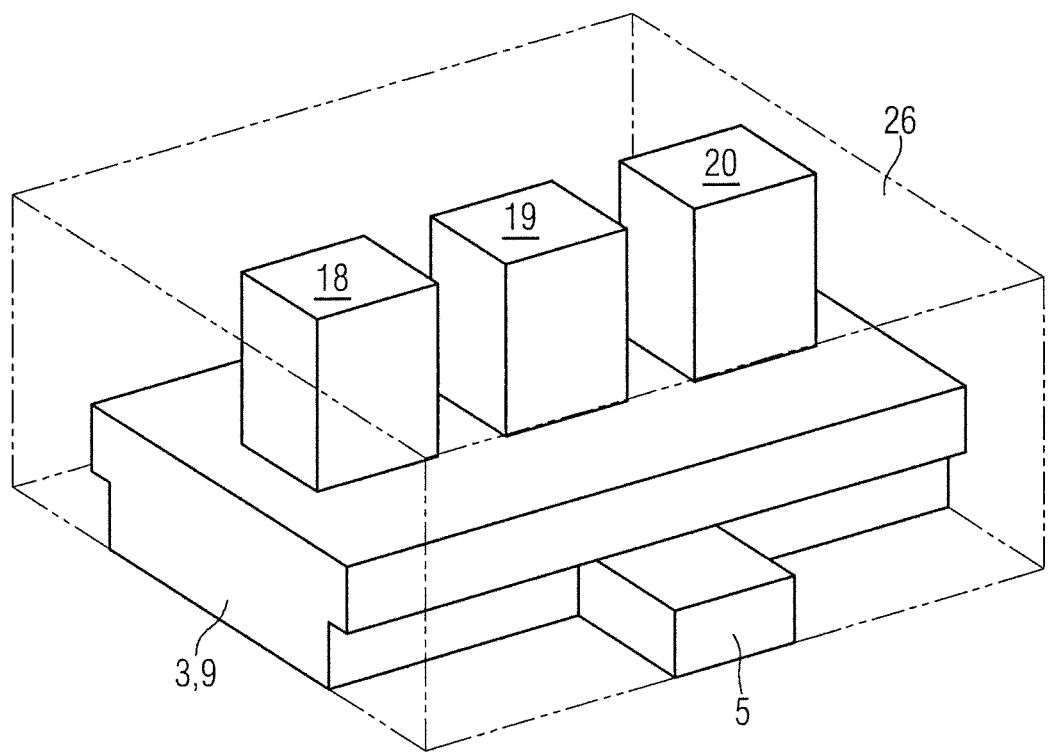
FIG. 12 shows the arrangement from FIG. 10 in a perspective view.

FIG. 11 shows a view of the segment from FIG. 10 from below. FIG. 12 shows a perspective illustration of the segment from FIG. 10, wherein the housing material 26 is illustrated in a transparent fashion. In the example illustrated, the strip 3 comprises a laterally stepped contour that enables better adhesion in the housing material 26. Moreover, it is clearly discernible that the segments 10, 11 comprise a smaller height and a smaller width than the strips 3. The example illustrated in FIGS. 10 to 12 may be operated as an optoelectronic component after being correspondingly provided with electrical lines. The segment of the strip 3 that is illustrated in FIGS. 10 to 12 constitutes a leadframe section 9.

Figure 13:
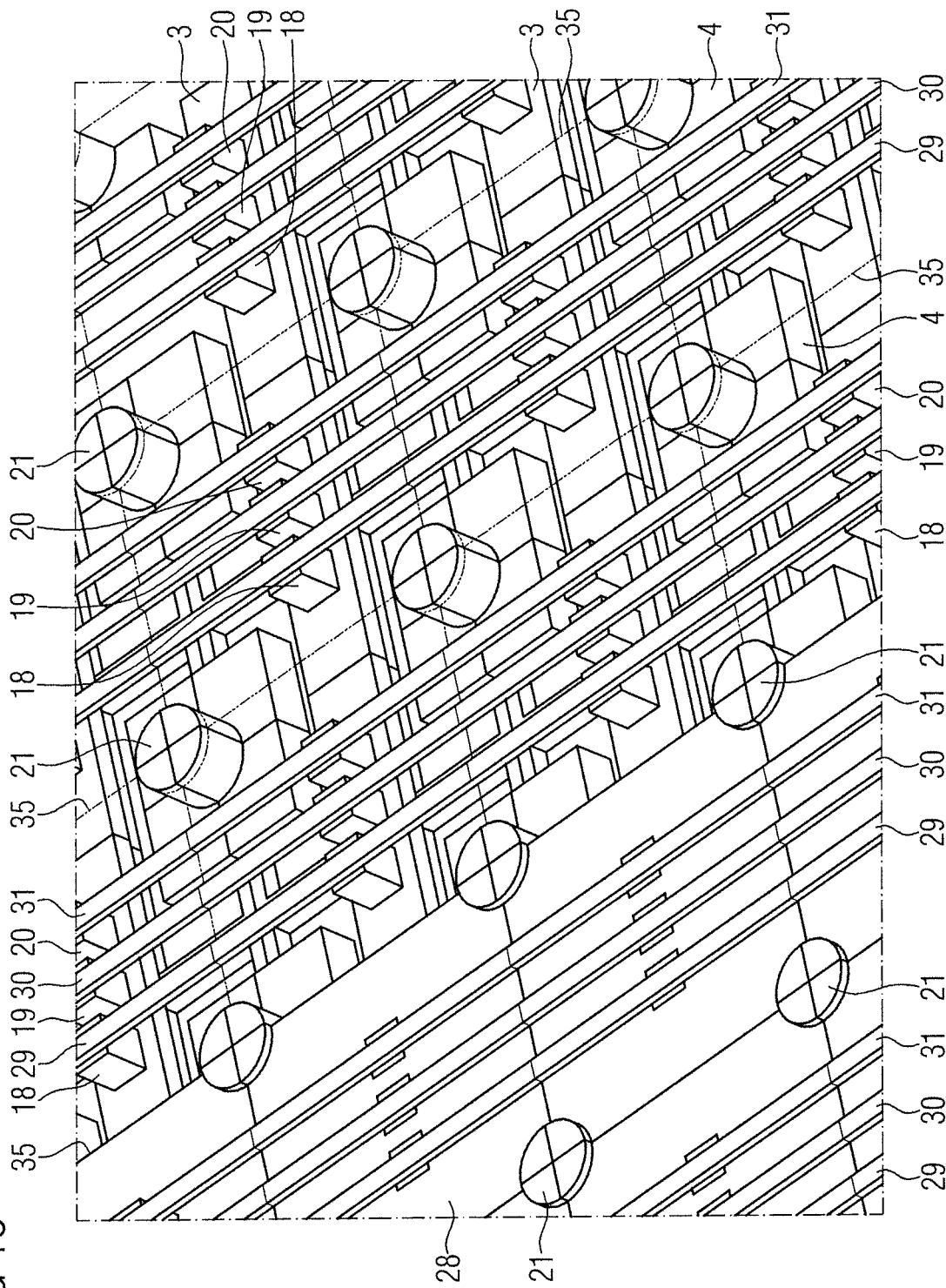
FIG. 13 shows, in a schematic illustration, a top side of a leadframe with semiconductor chips, contact pads, conduction elements and lines in a partly transparent illustration.

FIG. 13 shows, in an enlarged illustration, the arrangement from FIG. 4 after the electrical lines have been applied, wherein the housing 28 is illustrated in a transparent fashion in a right-hand region of FIG. 13. Moreover, cut edges 35 are illustrated schematically, which represent the segment for a later optoelectronic component.

Figure 14:
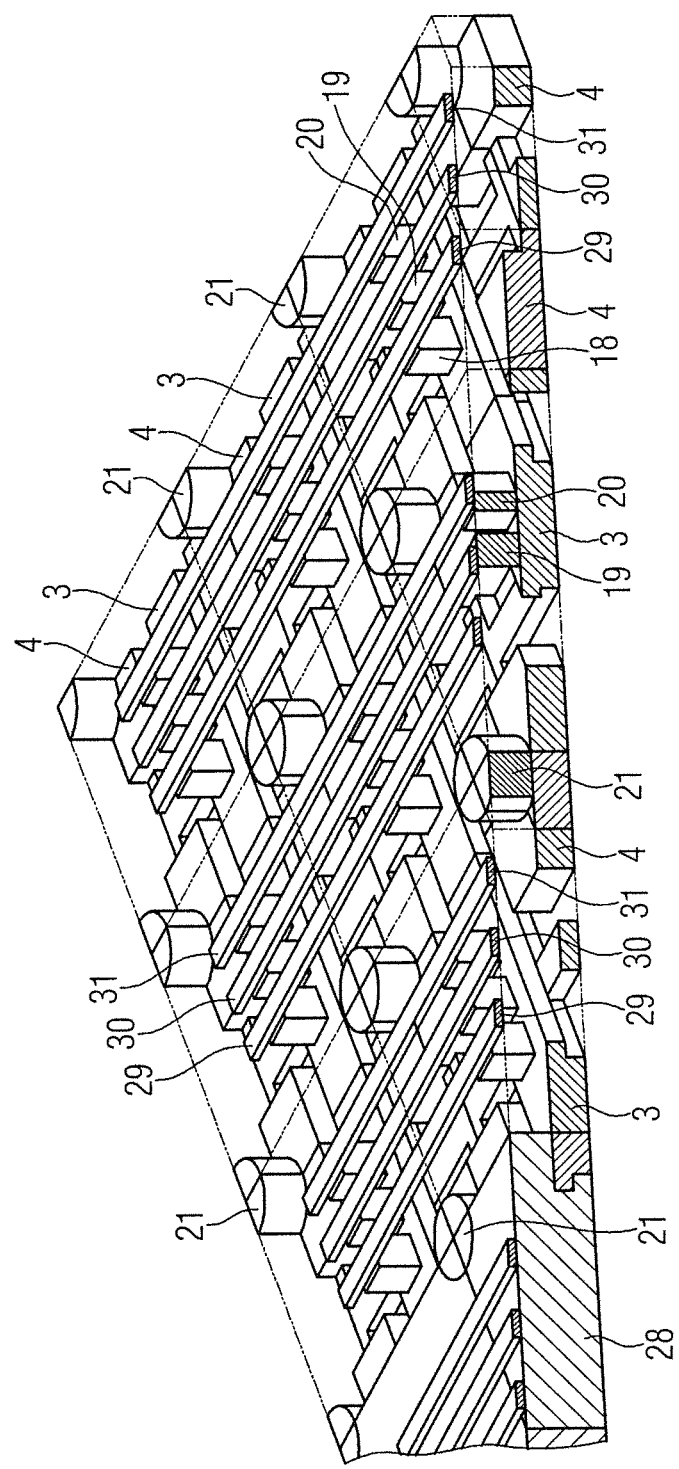
FIG. 14 shows a cross section through the arrangement from FIG. 13.

FIG. 14 shows a cross section through the arrangement from FIG. 13. In this case, the housing 28 is illustrated in a transparent fashion in large regions.

Figure 15:
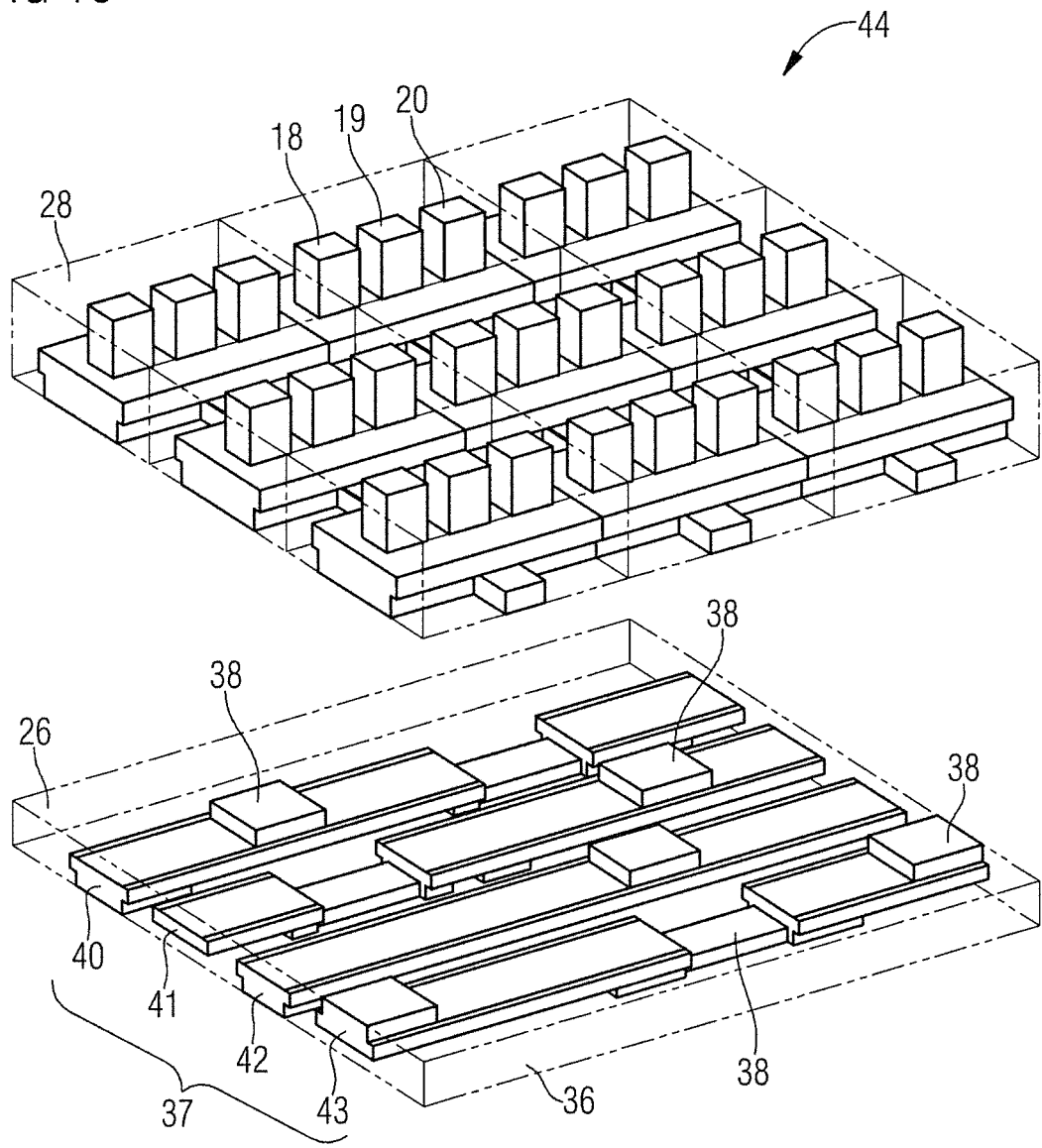
FIG. 15 shows a schematic exploded illustration of a component.

FIG. 15 shows, in a perspective partly transparent illustration, an optoelectronic component 44 comprising 3×3 segments 8. The electrical lines are not illustrated in the illustration chosen. Moreover, FIG. 15 shows a configurational form in which the configuration of contact pads and conduction elements has been dispensed with. The optoelectronic component may also comprise contact pads and conduction elements as illustrated, for example, in FIG. 7 or 13. A second housing 36 is arranged on an underside of the component 44. The second housing 36 comprises a conduction structure 37, which is embedded into an electrically insulating housing material 26. The conduction structure 37 borders on the top side of the second housing 36 at predefined contact locations 38. Consequently, an electrically conductive contacting with the underside of the leadframe sections 9 of the component may be achieved via the contact locations 38. Moreover, the conduction structure 37 in the example illustrated comprises a plurality of further lines 40, 41, 42, 43 arranged parallel to one another. The further lines may comprise different widths and/or thicknesses. Moreover, the further lines 40, 41, 42, 43 may also be partly connected to one another. In all of the examples, the second housing 36 may also be configured integrally with the housing 28.

Figure 16:
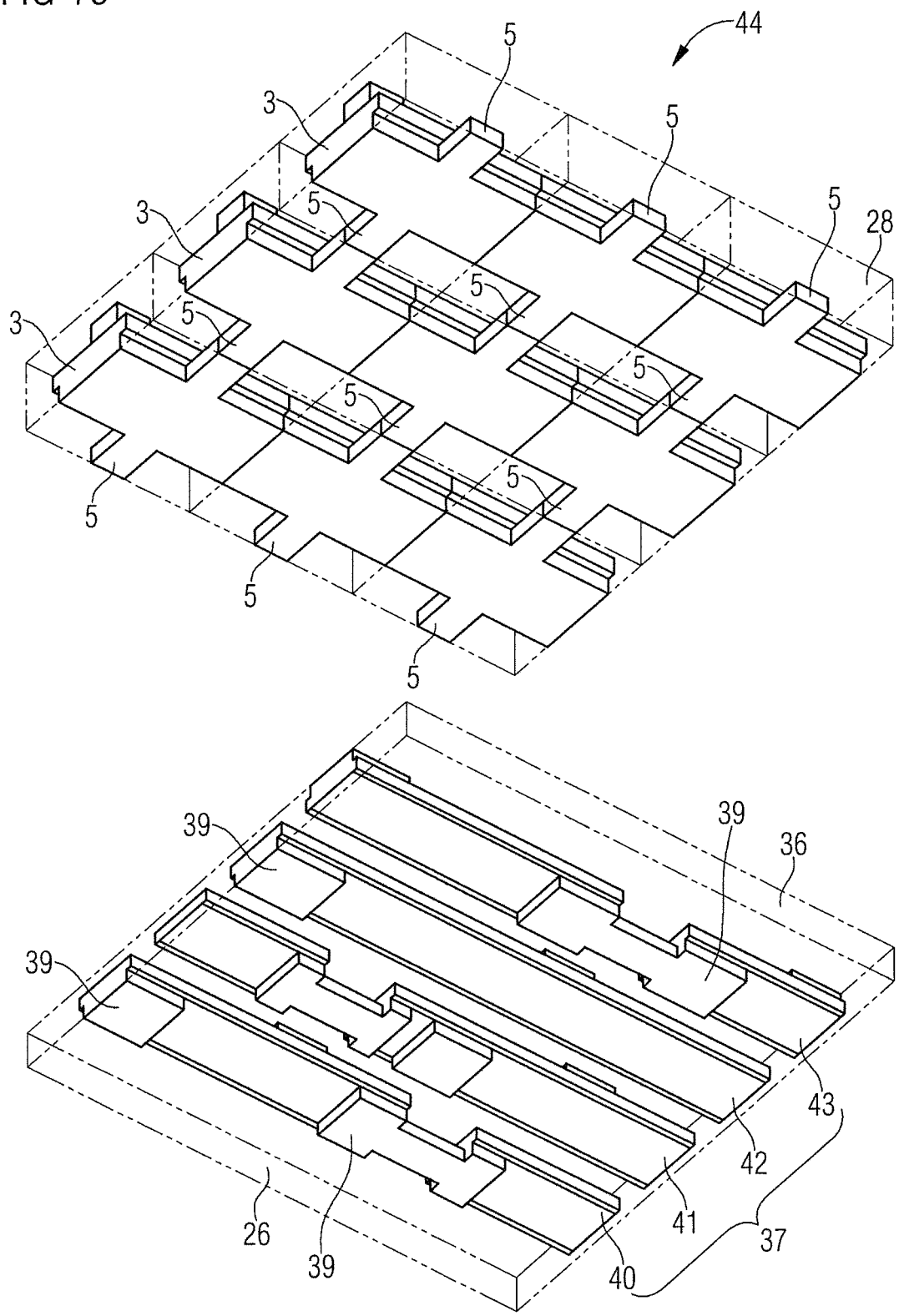
FIG. 16 shows a schematic exploded illustration of the component from FIG. 15 from below.

FIG. 16 shows the arrangement from FIG. 15 in a perspective and partly transparent illustration, wherein, on the underside of the second housing 36, the conduction structure 37 adjoins the underside of the second housing 36 at second contact locations 39. In this way, it is possible to effect an electrical contacting of the conduction structure 37 from the underside of the second housing 36. The example of the component without the use of contact pads enables a further miniaturization of the arrangement of the semiconductor chips. An electronic circuit and/or an optoelectronic semiconductor chip may also be arranged in the second housing 36. The second housing 36 may comprise, for example, a driver chip, a sensor chip, in particular, for example, a temperature sensor chip, a brightness sensor chip, a color sensor chip, a memory chip, in particular, for example, a read only memory chip or a rewritable memory chip, or an ESD protective chip.

Instead of the second housing 36 with the conduction structure 37 for a desired electrical wiring of the semiconductor chips 18, 19, 20 of the component 44 a corresponding layer structure comprising electrically conductive and electrically insulating layers may be applied on the underside of the component 44. The desired wiring may also be realized in this way.

The layer structure comprises a conduction structure comprising predefined contact locations at a top side and at an underside. Consequently, an electrically conductive contacting with the underside of the leadframe sections 9 of the component may be achieved via the contact locations at the top side. The contact locations at the underside serve for the electrical contacting of the component.

To that end, by way of example, a whole-area first metallization layer is applied on the rear side of the component 44, wherein the first metallization layer is structured in accordance with the desired electrical line routing and comprises the contact locations. A whole-area first passivation layer is then applied on the structured first metallization layer. The first passivation layer is then structured. Furthermore, a whole-area second metallization layer may be applied on the structured first passivation layer. The second metallization layer is structured and a whole-area second passivation layer is applied on the structured second metallization layer. The second passivation layer may then in turn be structured or the like. On the underside of the layer structure, the contact locations of the underside are formed by a metallization layer. A wide variety of electrical line connections for the semiconductor chips may be realized by the layer structure.

Moreover, an electronic circuit and/or an optoelectronic semiconductor chip may also be arranged in the layer structure. The layer structure may comprise, for example, a driver chip, a sensor chip, in particular a temperature sensor chip, a brightness sensor chip, a color sensor chip, a memory chip, in particular a read only memory chip or a rewritable memory chip, or an ESD protective chip.

Figure 17:
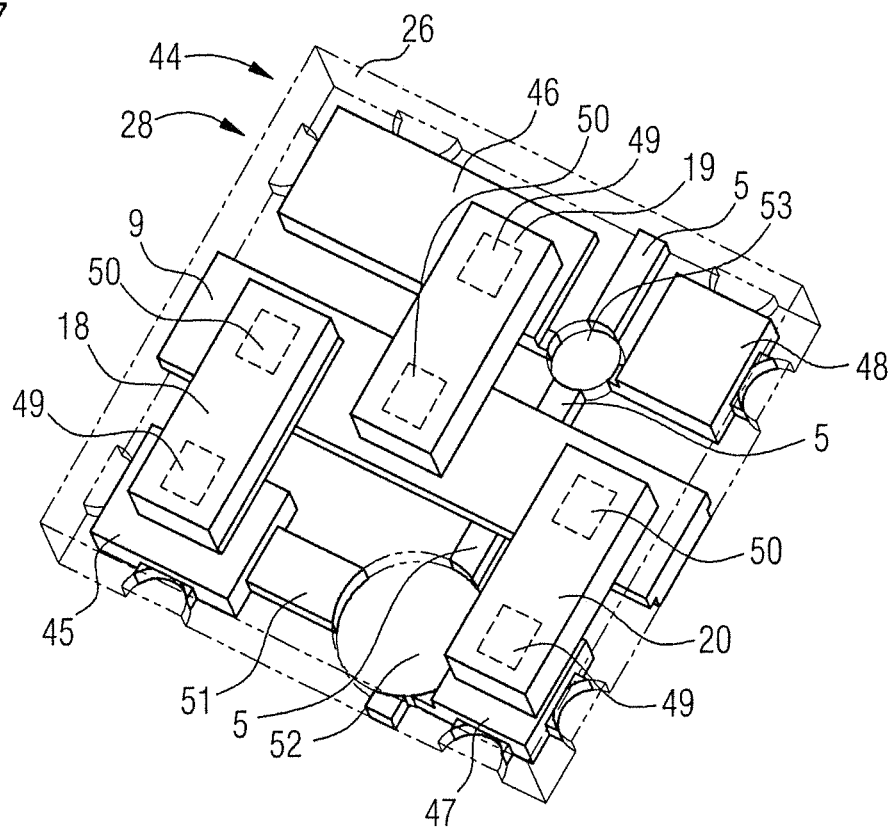
FIG. 17 shows a schematic exploded illustration of a further example of a component.

FIG. 17 shows a further example of an optoelectronic component 44 comprising a housing 28 comprising three semiconductor chips 18, 19, 20, which in this example each comprise two electrical terminals 49, 50 on undersides. The electrical terminals 49, 50 are illustrated schematically with the aid of dashed lines. The two electrical terminals 49, 50 of a semiconductor chip 18, 19, 20 respectively connect to two different leadframe sections 9, 45, 46, 47. In the example shown, the second electrical terminal 50 of the semiconductor chips 18, 19, 20 connects to the leadframe section 9. The first terminals 49 of the semiconductor chips 18, 19, 20 connect to different further second, third and fourth leadframe sections 45, 46, 47. In this way, each further leadframe section 45, 46, 47 may connect to a different potential and be energized independently of the other leadframe sections 45, 46, 47.

By way of example, the leadframe section 9 may connect to ground potential. The further leadframe sections 45, 46, 47 may connect to different or identical positive voltage potentials. The leadframe sections 9, 45, 36, 47, 48 may originally have been configured integrally with one another in the form of a leadframe via the connection webs 5 and the further connection webs 51, before the connection webs 5, 51 were separated. Separating sections 52, 53 are schematically illustrated as annuli. By way of example, the separating sections 52, 53 may be introduced into the connection webs 5, 51 with the aid of stamping tools or with the aid of a laser or with the aid of an etching method.

The first terminals 49 of the semiconductor chips 18, 19, 20 may also be arranged only on the second leadframe section 45 and electrically conductively connect to the second leadframe section 45. In this example, it is not possible for the individual semiconductor chips 18, 19, 20 to be driven separately.

Each of the leadframe sections 9,45,46,47,48 may comprise a stiffening structure in the form of a segment of a connection web 5, 51. The leadframe sections 9,45,46,47,48, the stiffening structures 5, 51 and the semiconductor chips 18, 19, 20 are embedded into the housing material 26. The housing material 26 is illustrated in a transparent fashion and forms the housing 28. The housing material 26 comprises the properties explained with respect to the previous examples. The housing material 26 may be transparent to electromagnetic radiation. Moreover, the top sides of the semiconductor chips and the undersides of the leadframe sections 9,45,46,47,48 may be free of the housing material.

The semiconductor chips 18, 19, 20 constitute optoelectronic semiconductor chips configured, for example, in the form of light emitting diode chips (LED chips) or in the form of light-absorbing semiconductor chips, for example, photodiode chips. The semiconductor chips 18, 19, 20 may be configured identically or differently. A light emitting diode chip and a photodiode chip may be arranged on a leadframe section 9. The light emitting diode chip may be configured to emit an electromagnetic radiation of arbitrary wavelength. Moreover, more than three or fewer than three semiconductor chips may be arranged in a component. In particular, light emitting diode chips 18, 19, 20 configured to emit electromagnetic radiation comprising different wavelengths may be arranged in a component. By way of example, a component may comprise a light emitting diode chip comprising blue light, a light emitting diode chip comprising red light and a light emitting diode chip comprising green light.

Figure 18:
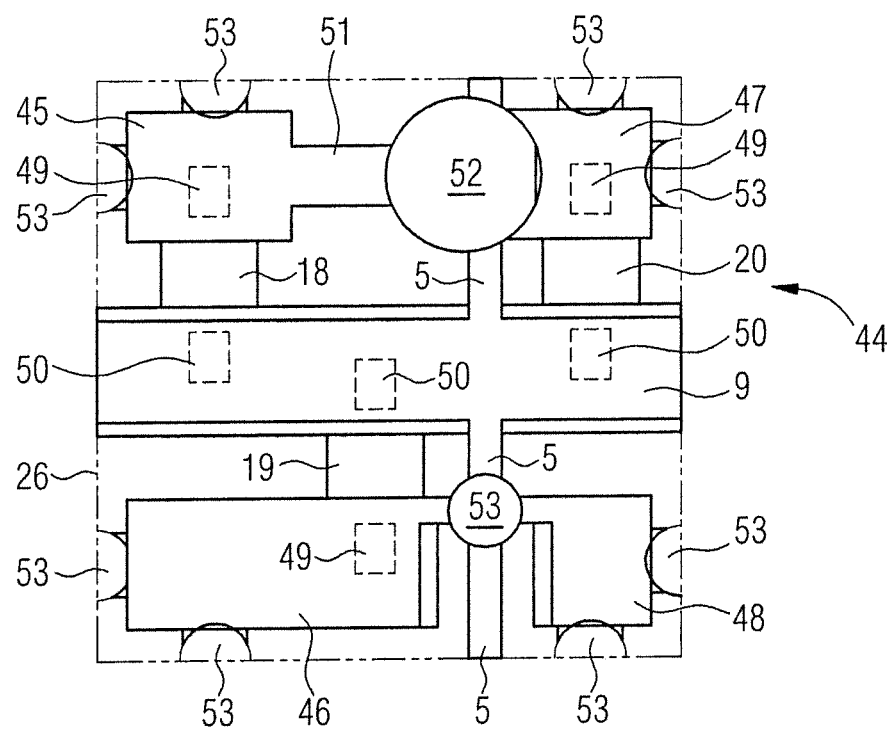
FIG. 18 shows a plan view of the component from FIG. 17 from below.

FIG. 18 shows the underside of the component 44 from FIG. 17. The electrical terminals 49, 50 (not visible) of the semiconductor chips 18, 19, 20 are again depicted by dashed lines. The electrical contacting may either be effected directly via the undersides of the leadframe sections 9, 45, 46, 47 or a second housing comprising a redistribution wiring in accordance with FIGS. 15 and 16 may also be provided. The second housing comprises a conduction structure embedded into an electrically insulating housing material. The conduction structure borders on the top side of the second housing at predefined contact locations. Consequently, an electrically conductive contacting with the undersides of the leadframe sections 9, 45, 46, 47 of the component 44 may be achieved via the contact locations. Moreover, the conduction structure comprises, e.g., a plurality of further lines arranged parallel to one another. The further lines may comprise different widths and/or thicknesses. Moreover, the further lines may also partly connect to one another.

An electronic circuit and/or an optoelectronic semiconductor chip may also be arranged in the second housing. The second housing may comprise, for example, a driver chip, a sensor chip, in particular, for example, a temperature sensor chip, a brightness sensor chip, a color sensor chip, a memory chip, in particular, for example, a read only memory chip or a rewritable memory chip, or an ESD protective chip.

Instead of the second housing with the conduction structure for a desired electrical contacting and/or wiring of the semiconductor chips 18, 19, 20 of the component 44 a corresponding layer structure comprising electrically conductive and electrically insulating layers may be applied on the underside of the component 44. The desired wiring may also be realized in this way. To that end, by way of example, a whole-area first metallization layer is applied on the rear side of the component 44, wherein the first metallization layer is structured in accordance with the desired electrical line routing. A whole-area first passivation layer is then applied on the structured first metallization layer. A structuring of the first passivation layer may then be carried out. Furthermore, a whole-area second metallization layer may be applied on the structured first passivation layer. The second metallization layer is structured and a whole-area second passivation layer is applied on the structured second metallization layer. The second passivation layer may then in turn be structured and the like. A wide variety of electrical line connections for the semiconductor chips may be realized by the layer structure.

An electronic circuit and/or an optoelectronic semiconductor chip may also be arranged in the layer structure. The layer structure may comprise, for example, a driver chip, a sensor chip, in particular, for example, a temperature sensor chip, a brightness sensor chip, a color sensor chip, a memory chip, in particular, for example, a read only memory chip or a rewritable memory chip, or an ESD protective chip.

Figure 19:
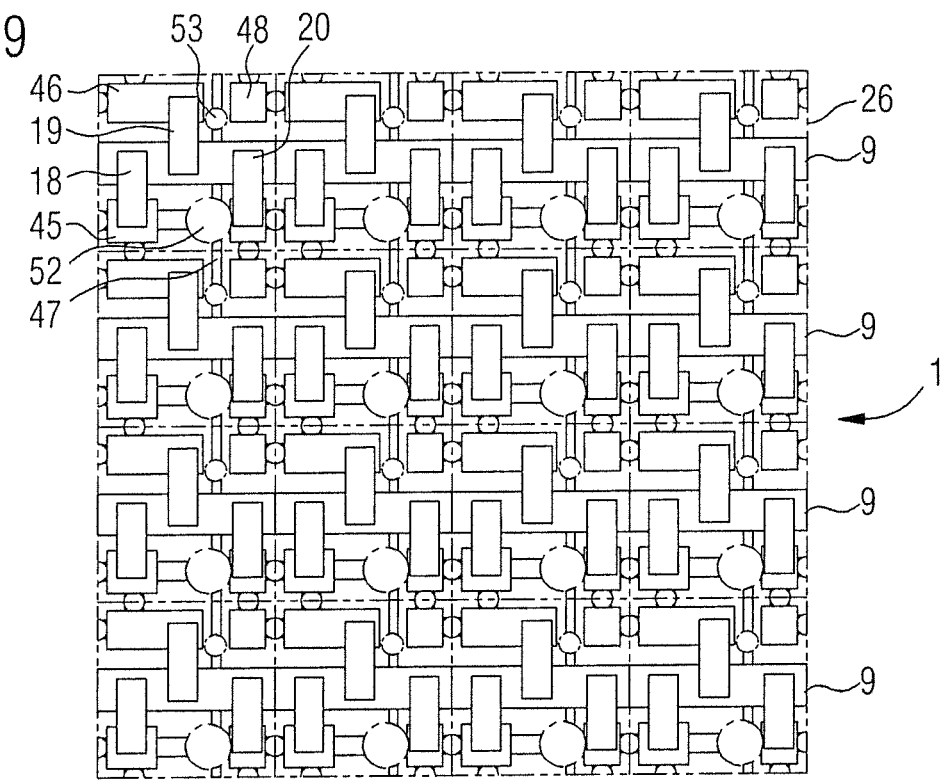
FIG. 19 shows a schematic exploded illustration of an arrangement comprising a plurality of components.

FIG. 19 shows an arrangement comprising a leadframe 1 comprising leadframe sections 9, 45, 46, 47, 48, wherein optoelectronic semiconductor chips 18,19,20 are arranged on the leadframe sections and the semiconductor chips and the leadframe sections are embedded into the housing material 26. The top sides of the semiconductor chips 18, 19, 20 may be free of the housing material 26. Likewise, the undersides of the leadframe sections 9, 45, 46, 47, 48 may be free of the housing material 26. The leadframe 1 has not yet been divided into individual components 44, as illustrated in FIGS. 17 and 18. However, the individual leadframe sections 9, 45, 46, 47, 48 have already been separated from one another via separating sections 52, 53.

Figure 20:
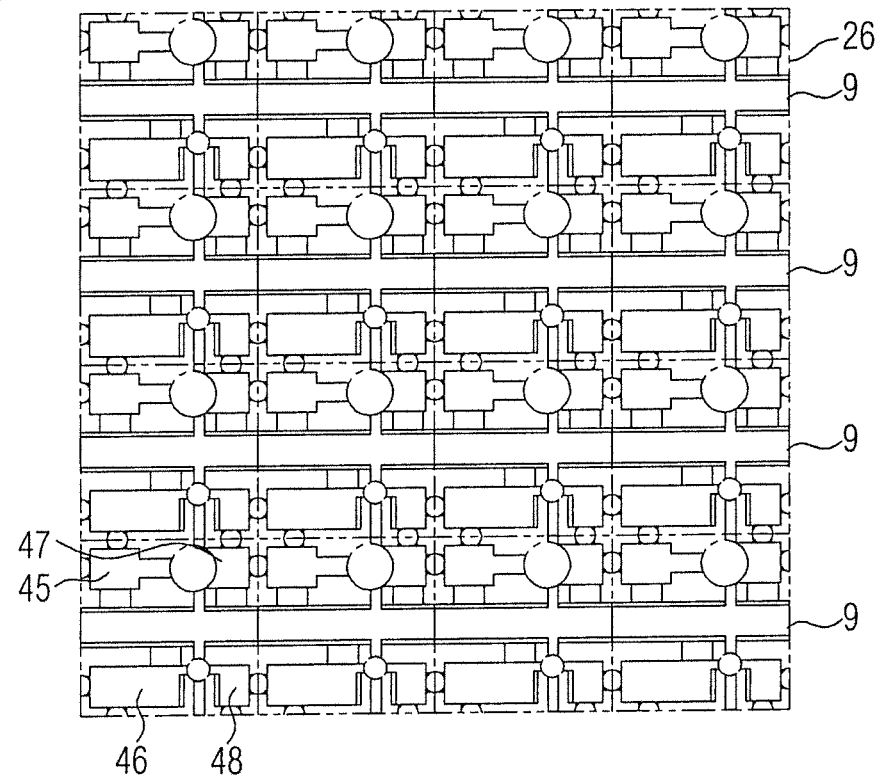
FIG. 20 shows a plan view of the arrangement from FIG. 19 from below.

FIG. 20 shows the underside of the arrangement from FIG. 19.

The optoelectronic components may be configured, for example, as SMT component for surface mounting. A QFN module may be provided with the aid of the method described. The optoelectronic components may thus be produced in a QFN design, wherein parts of the leadframe are used as reinforcement and securing structure in the housing. The conduction elements constitute plated-through holes. The conduction elements may also be introduced into the housing after the housing has been formed. Various partial segments may be separated from the leadframe. The electrical contacting with the aid of the lines is to be implemented in accordance with the semiconductor chips used and the number of semiconductor chips of the component. The optoelectronic components may be used, for example, to realize video walls or video screens. The video walls may be constructed from a multiplicity of optoelectronic components. An optoelectronic component may comprise, for example, a 3×3 or 6×6 or 9×9 or the like arrangement of leadframe sections with semiconductor chips.

The optoelectronic component described and the method described make it possible to construct optoelectronic components comprising a high packing density of optoelectronic semiconductor chips comprising a corresponding electrical contacting for the driving of the semiconductor chips. Moreover, a semiconductor chip comprising a stiffening structure is provided such that very thin leadframes and thin housings may be used for the configuration of the components.

Although my components and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2015 116 855.3, the subject matter of which is incorporated herein by reference.

The invention claimed is:

1. An optoelectronic component comprising at least one optoelectronic semiconductor chip, wherein the at least one optoelectronic semiconductor chip is arranged on top of a leadframe section, the leadframe section comprises a stiffening structure projecting away laterally from the leadframe section, and the leadframe section, the stiffening structure and the at least one optoelectronic semiconductor chip are embedded in an electrically insulating housing, wherein an electrical line is applied on a surface of a top side of the housing, and the electrical line electrically contacts the at least one optoelectronic semiconductor chip.

2. The optoelectronic component according to claim 1, wherein the leadframe section connects to a further leadframe section via the stiffening structure, a conduction element is arranged on a top side of the further leadframe section, wherein the conduction element extends to the surface of the top side of the housing, and wherein the conduction element is embedded in the housing.

3. The optoelectronic component according to claim 1, wherein the leadframe section connects to a further leadframe section via the stiffening structure, a conduction element is arranged on a top side of the further leadframe section, the further leadframe section and the conduction element are embedded in the housing, and the stiffening structure is separated from the further leadframe section, or wherein the leadframe section connects to a further leadframe section via the stiffening structure, a conduction element is arranged on a top side of the further leadframe section, the further leadframe section and the conduction element are embedded in the housing, the leadframe section connects to at least one second further leadframe section via a second stiffening structure, a second conduction element is arranged on a top side of the second further leadframe section, and the second stiffening structure together with the second further leadframe section and the second conduction element are embedded in the housing.

4. The optoelectronic component according to claim 1, further comprising a further leadframe section, wherein a conduction element is arranged on a top side of the further leadframe section, wherein the further leadframe section and the conduction element are embedded in the housing, wherein the conduction element extends to the surface of the top side of the housing, the stiffening structure is guided from the lead frame section in a direction to the further lead frame section, but ends before reaching the further lead frame section.

5. The optoelectronic component according to claim 2, wherein the electrical line electrically contacts the at least one optoelectronic semiconductor chip, and the electrical line contacts with the least one conduction element of the optoelectronic component.

6. The optoelectronic component according to claim 1, wherein at least one second optoelectronic semiconductor chip is arranged on the leadframe section, and the at least one second optoelectronic semiconductor chip is embedded into the housing.

7. The optoelectronic component according to claim 1, wherein at least one second optoelectronic semiconductor chip is arranged on the leadframe section, the at least one second optoelectronic semiconductor chip is embedded into the housing, a second electrical line is arranged on the housing, the second electrical line electrically contacts the at least one second optoelectronic semiconductor chip, and the second electrical line electrically contacts a second conduction element of the optoelectronic component.

8. The optoelectronic component according to claim 1, wherein the optoelectronic semiconductor chip comprises two electrical terminals on an underside, the first electrical terminal is arranged on the leadframe section and electrically conductively connects to the leadframe section, a further leadframe section is provided, the second electrical terminal is arranged on the further leadframe section and electrically conductively connects to the further leadframe section, and the further leadframe section is embedded into the housing.

9. The optoelectronic component according to claim 1, wherein the leadframe section connects to a further leadframe section via the stiffening structure, a conduction element is arranged on a top side of the further leadframe section, the further leadframe section and the conduction element are embedded in the housing, the leadframe section connects to at least one second further leadframe section via a second stiffening structure, a second conduction element is arranged on a top side of the second further leadframe section, the second stiffening structure together with the second further leadframe section and the second conduction element are embedded in the housing, and the stiffening structure and the second stiffening structure and/or the further and the second further leadframe sections are arranged on opposite sides of the leadframe section.

10. The optoelectronic component according to claim 1, wherein the stiffening structure comprises a smaller thickness and/or a smaller width than the leadframe section, and the stiffening structure and the leadframe section are integral.

11. The optoelectronic component according to claim 1, wherein the optoelectronic component is provided with a second housing, the second housing comprises a conduction structure, and the conduction structure electrically conductively connects to the optoelectronic semiconductor chip.

12. The optoelectronic component according to claim 1, wherein the optoelectronic semiconductor chip comprises two electrical terminals on an underside, the first electrical terminal is arranged on the leadframe section and electrically conductively connects to the leadframe section, a further leadframe section is provided, the at least one second electrical terminal is arranged on the further leadframe section and electrically conductively connects to the further leadframe section, the further leadframe section is embedded into the housing, at least one second optoelectronic semiconductor chip is provided, the at least one second optoelectronic semiconductor chip comprises two electrical terminals on an underside, the first electrical terminal is arranged on the leadframe section and electrically conductively connects to the leadframe section, and the second electrical terminal is arranged on a second further leadframe section and electrically conductively connects to the second further leadframe section.

13. A method of producing an optoelectronic component comprising at least one optoelectronic semiconductor chip comprising:
providing a leadframe comprising a plurality of leadframe sections connected to one another via stiffening structures,
applying at least one optoelectronic semiconductor chip on a top side of a first leadframe section, embedding the first leadframe section with the at least one semiconductor chip into an electrically insulating housing, and
separating the first leadframe section with the at least one semiconductor chip and at least one stiffening structure from the rest of the leadframe to thus obtain the optoelectronic component, wherein an electrical line is applied on a surface of a top side of the insulating housing, and the electrical line electrically contacts the at least one optoelectronic semiconductor chip.

14. The method according to claim 13, wherein the first leadframe section connects to a further leadframe section via a first stiffening structure, and prior to the embedding into the housing, a conduction element is applied on a top side of the further leadframe section and, after the embedding into the housing, the first leadframe with the semiconductor chip, the at least one stiffening structure and the further leadframe section with the conduction element are separated from the rest of the leadframe to thus obtain the optoelectronic component.

15. The method according to claim 13,
wherein at least one second leadframe section is provided, and an at least one second optoelectronic semiconductor chip is applied on at least one second leadframe section, the at least one second leadframe section comprises at least one further stiffening structure, the first leadframe section and the at least one second leadframe section and the first and the second optoelectronic semiconductor chips are embedded into the housing, and the first leadframe section and the second leadframe section are singulated in the form of one optoelectronic component or in the form of two optoelectronic components.

16. The method according to claim 13, wherein an at least one further leadframe section and a conduction element are divided into at least two conduction elements and at least two further leadframe sections during the process of separating an optoelectronic component.

17. The method according to claim 13, wherein the optoelectronic component is provided with a second housing, the second housing comprises a conduction structure, and the conduction structure electrically conductively connects to the at least one optoelectronic semiconductor chip.

18. The method according to claim 13, wherein the at least one optoelectronic semiconductor chip comprises an electrical terminal at least on a top side, an electrical line is applied on a top side of the housing, the electrical line electrically contacts with the electrical terminal of the at least one optoelectronic semiconductor chip, and the electrical line contacts at least one conduction element of the optoelectronic component.

19. The method according to claim 13, wherein at least one second leadframe section is provided, the at least one optoelectronic semiconductor chip comprises two electrical terminals on an underside, the first electrical terminal is arranged on the first leadframe section and electrically conductively connects to the first leadframe section, and the second electrical terminal is arranged on the second leadframe section and electrically conductively connects to the second leadframe section.

20. The method of claim 13, wherein the first stiffening structure is separated from the further leadframe section before the first leadframe section, and the separated first stiffening structure and the further leadframe section are embedded into the electrically insulating housing.

21. An optoelectronic component comprising at least one optoelectronic semiconductor chip, wherein the at least one optoelectronic semiconductor chip is arranged on a leadframe section, the leadframe section comprises a stiffening structure projecting laterally away from the leadframe section, and the leadframe section, the stiffening structure and the at least one optoelectronic semiconductor chip are embedded in an electrically insulating housing, wherein a further leadframe section is arranged in the electrically insulating housing, a conduction element is arranged on a top side of the further leadframe section, wherein the conduction element extends to a surface of a top side of the electrically insulating-housing, and the stiffening structure is guided from the leadframe section in a direction to the further leadframe section, but ends before reaching the further leadframe section.

* * * * *